United States Patent
Sanders et al.

(10) Patent No.: US 9,871,008 B2
(45) Date of Patent: *Jan. 16, 2018

(54) MONOLITHIC MICROWAVE INTEGRATED CIRCUITS

(71) Applicant: Freescale Semiconductor, Inc., Austin, TX (US)

(72) Inventors: Paul W. Sanders, Scottsdale, AZ (US); Wayne R. Burger, Phoenix, AZ (US); Thuy B. Dao, Austin, TX (US); Joel E. Keys, Austin, TX (US); Michael F. Petras, Phoenix, AZ (US); Robert A. Pryor, Mesa, AZ (US); Xiaowei Ren, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/344,174

(22) Filed: Nov. 4, 2016

(65) Prior Publication Data
US 2017/0077051 A1    Mar. 16, 2017

Related U.S. Application Data

(60) Continuation of application No. 14/693,781, filed on Apr. 22, 2015, now Pat. No. 9,508,599, which is a
(Continued)

(51) Int. Cl.
*H01L 23/66* (2006.01)
*H01L 23/522* (2006.01)
(Continued)

(52) U.S. Cl.
CPC ........ *H01L 23/66* (2013.01); *H01L 21/76898* (2013.01); *H01L 21/823475* (2013.01);
(Continued)

(58) Field of Classification Search
CPC ... H01L 23/5226; H01L 23/66; H01L 23/481; H01L 2225/06541; H01L 27/0629; H01L 29/7816
See application file for complete search history.

(56) References Cited

U.S. PATENT DOCUMENTS 5,063,177 A    11/1991 Geller et al.
5,276,406 A     1/1994 Samay et al.
(Continued)

FOREIGN PATENT DOCUMENTS

CN    1373514 A    10/2002
CN    1934703 A     3/2007
WO    2005067043 A1  7/2005

OTHER PUBLICATIONS

Office Action dated Feb. 28, 2015 for CN Application No. CN 201110236686.0 14 pgs.

*Primary Examiner* — Joseph C Nicely
(74) *Attorney, Agent, or Firm* — Sherry W. Schumm (57) ABSTRACT

Low Q associated with passive components of monolithic integrated circuits (ICs) when operated at microwave frequencies can be avoided or mitigated using high resistivity (e.g., ≥100 Ohm-cm) semiconductor substrates and lower resistance inductors for the IC. This eliminates significant in-substrate electromagnetic coupling losses from planar inductors and interconnections overlying the substrate. The active transistor(s) are formed in the substrate proximate the front face. Planar capacitors are also formed over the front face of the substrate. Various terminals of the transistor(s), capacitor(s) and inductor(s) are coupled to a ground plane on the rear face of the substrate using through-substrate-vias to minimize parasitic resistance. Parasitic resistance associated with the planar inductors and heavy current carrying conductors is minimized by placing them on the outer surface of the IC where they can be made substantially thicker and of
(Continued)

lower resistance. The result is a monolithic microwave IC previously unobtainable.

20 Claims, 9 Drawing Sheets

Related U.S. Application Data division of application No. 12/855,479, filed on Aug. 12, 2010, now Pat. No. 9,064,712.

(51) Int. Cl.
- H01L 23/48 (2006.01)
- H01L 27/06 (2006.01)
- H03F 3/195 (2006.01)
- H01L 21/768 (2006.01)
- H01L 21/8234 (2006.01)
- H01L 27/07 (2006.01)
- H01L 49/02 (2006.01)
- H01L 29/78 (2006.01)
- H01L 23/00 (2006.01)

(52) U.S. Cl.
CPC ........ H01L 23/481 (2013.01); H01L 23/5223 (2013.01); H01L 23/5226 (2013.01); H01L 23/5227 (2013.01); H01L 27/0617 (2013.01); H01L 27/0629 (2013.01); H01L 27/0727 (2013.01); H01L 28/10 (2013.01); H01L 28/40 (2013.01); H01L 29/7816 (2013.01); H03F 3/195 (2013.01); H01L 24/49 (2013.01); H01L 2223/6616 (2013.01); H01L 2223/6655 (2013.01); H01L 2223/6683 (2013.01); H01L 2224/48091 (2013.01); H01L 2224/49175 (2013.01); H01L 2225/06541 (2013.01); H01L 2924/00014 (2013.01); H01L 2924/12044 (2013.01); H01L 2924/13062 (2013.01); H01L 2924/14 (2013.01); H01L 2924/1423 (2013.01); H01L 2924/30107 (2013.01)

(56) References Cited

U.S. PATENT DOCUMENTS

| | | |
|---|---|---|
| 5,580,798 A | 12/1996 | Grubisich |
| 5,639,683 A | 6/1997 | Reyes |
| 5,841,166 A | 11/1998 | D'Anna et al. |
| 5,949,104 A | 9/1999 | D'Anna et al. |
| 6,236,101 B1 | 5/2001 | Erdeljac et al. |
| 6,297,533 B1 | 10/2001 | Mkhitarian |
| 6,831,332 B2 | 12/2004 | D'Anna et al. |
| 6,890,629 B2 | 5/2005 | Casper et al. |
| 7,119,399 B2 | 10/2006 | Ma et al. |
| 8,129,265 B2 | 3/2012 | Lin |
| 8,344,496 B1 | 1/2013 | White et al. |
| 8,405,148 B1 | 3/2013 | You et al. |
| 9,042,860 B2 | 5/2015 | Arnborg |
| 9,064,712 B2 * | 6/2015 | Sanders ............... H01L 23/481 |
| 2001/0013813 A1 | 8/2001 | Forbes |
| 2002/0020894 A1 | 2/2002 | Nishijima |
| 2002/0121947 A1 | 9/2002 | Shim et al. |
| 2003/0141559 A1 | 7/2003 | Moscatelli et al. |
| 2004/0217840 A1 | 11/2004 | Lee et al. |
| 2005/0090094 A1 | 4/2005 | Oh et al. |
| 2005/0104679 A1 | 5/2005 | Blednov |
| 2005/0106825 A1 | 5/2005 | You et al. |
| 2005/0189587 A1 | 9/2005 | Ma et al. |
| 2005/0225420 A1 | 10/2005 | Chen |
| 2005/0248021 A1 | 11/2005 | Morkner |
| 2005/0253175 A1 | 11/2005 | Taddiken |
| 2006/0038257 A1 | 2/2006 | Anzai |
| 2006/0071296 A1 | 4/2006 | Nishijima |
| 2006/0214289 A1 | 9/2006 | Hansen |
| 2006/0220773 A1 | 10/2006 | Su et al. |
| 2006/0246674 A1 | 11/2006 | Terui |
| 2006/0263967 A1 | 11/2006 | Falster et al. |
| 2007/0026676 A1 | 2/2007 | Li et al. |
| 2007/0190692 A1 | 8/2007 | Erturk et al. |
| 2008/0217784 A1 | 9/2008 | Binder et al. |
| 2008/0238599 A1 | 10/2008 | Hebert et al. |
| 2008/0246114 A1 | 10/2008 | Abrokwah et al. |
| 2008/0257793 A1 | 10/2008 | Valerio |
| 2008/0315356 A1 | 12/2008 | Reisner |
| 2009/0184394 A1 | 7/2009 | Lin |
| 2009/0200985 A1 | 8/2009 | Zane et al. |
| 2009/0261446 A1 | 10/2009 | Gogoi |
| 2009/0301557 A1 | 12/2009 | Agostinelli et al. |
| 2010/0032808 A1 | 2/2010 | Ding et al. |
| 2010/0093169 A1 | 4/2010 | Kuo |
| 2010/0120254 A1 | 5/2010 | Bedinger et al. |
| 2010/0127345 A1 | 5/2010 | Sanders et al. |
| 2010/0140665 A1 | 6/2010 | Singbal et al. |
| 2010/0140714 A1 | 6/2010 | Ren et al. |
| 2010/0171197 A1 | 7/2010 | Chang et al. |
| 2010/0237472 A1 | 9/2010 | Gillis et al. |
| 2010/0252934 A1 | 10/2010 | Law et al. |
| 2010/0321842 A1 | 12/2010 | Gebreselasie et al. |
| 2011/0031581 A1 | 2/2011 | West |
| 2011/0102077 A1 | 5/2011 | Lamey et al. |
| 2011/0127527 A1 | 6/2011 | Kub et al. |
| 2011/0198609 A1 | 8/2011 | Huang |
| 2011/0233630 A1 | 9/2011 | Dertinger et al. |
| 2012/0001171 A1 | 1/2012 | Atanackovic |
| 2012/0024456 A1 * | 2/2012 | Lin ..................... H01L 22/26 156/64 |
| 2012/0116209 A1 | 5/2012 | Klee et al. |
| 2012/0235295 A1 | 9/2012 | Ahn et al. |
| 2012/0258677 A1 | 10/2012 | Dupuy et al. |
| 2012/0314371 A1 | 12/2012 | Mishra et al. |
| 2013/0119465 A1 | 5/2013 | Mallikarjunaswamy |
| 2013/0181238 A1 | 7/2013 | Tischler et al. |
| 2013/0207192 A1 | 8/2013 | Parthasarathy et al. |
| 2014/0035092 A1 | 2/2014 | Kjar |

* cited by examiner

MONOLITHIC MICROWAVE INTEGRATED CIRCUITS

RELATED APPLICATION

This application is a continuation of co-pending U.S. patent application Ser. No. 14/693,781, filed on Apr. 22, 2015, which is a divisional of U.S. Pat. No. 9,064,712, filed on Aug. 12, 2010.

FIELD OF THE INVENTION

The present invention generally relates to semiconductor devices and circuits and methods for fabricating semiconductor devices and circuits, and more particularly relates to monolithic integrated circuits adapted to operate at very high frequencies, including microwave frequencies.

BACKGROUND OF THE INVENTION

As the electronic arts have progressed there is an ongoing need for solid state circuits adapted to operate at higher and higher frequencies, including microwave frequencies. As used herein, the term "microwave" is intended to refer to frequencies at or above about 800 mega-Hertz. Various transistor structures have been created that are capable of providing gain in such frequency ranges. Passive components, e.g., inductors, and capacitors, must often be combined with such solid state amplifiers in order to achieve the desired circuit functions, for example and not intended to be limiting, power amplifiers, modulators, filters, oscillators, etc. However, as the desired operating frequencies have increased, conventional approaches for monolithically forming such active and passive elements on a common substrate have not proved practical for microwave structures and satisfactory performance has so far necessitated assembling separately produced passive and active elements. Thus, there is an ongoing need for monolithic integrated circuits having both passive and active elements, manufactured at substantially the same time on a common monolithic substrate, that are capable of operating at microwave frequencies.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" and "SC substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

For convenience of explanation and not for limitation, various embodiments of the invention will be illustrated using lateral-(double)-diffused-metal-oxide-semiconductor (LDMOS) active devices, which are preferred. However, many other active device types may also be employed and are intended to be included within the scope of the invention, as for example and not intended to be limiting, bipolar devices, junction field effect devices, various insulated gate field effect devices, HBT, and so forth. As used herein, the term metal-oxide-semiconductor and the abbreviation MOS are to be interpreted broadly. In particular, it should be understood that they are not limited merely to structures that use "metal" and "oxide", but may employ any type of conductor, including "metal", and any type of dielectric, including "oxide". The term "field-effect-transistor" is abbreviated as "FET" and the term "insulated-gate-FET" is abbreviated as "IGFET".

Figure 1:
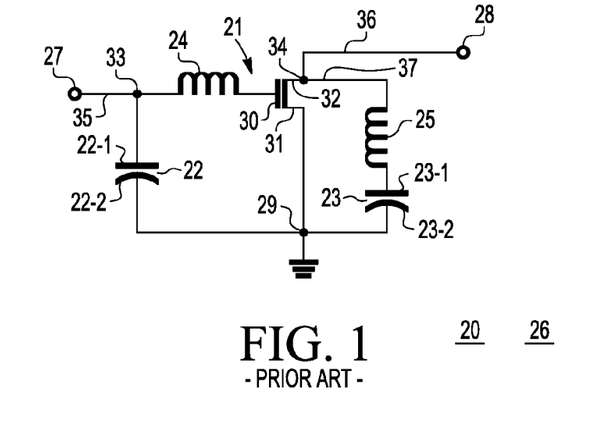
FIG. 1 is a simplified electrical schematic diagram of an insulated gate field effect transistor combined with capacitors and inductors to form a microwave amplifier, according to the prior art.

FIG. 1 shows simplified electrical schematic circuit 20 of IGFET 21 combined with capacitances 22, 23 and inductances 24, 25 to form microwave amplifier 26 having input terminal 27, output terminal 28 and reference terminal or node 29, according to the prior art. For convenience of description, terminal or node 29 may also referred to as "ground" (abbreviated as "GND"), irrespective of whether or not an earth connection is provided. Input terminal 27 is coupled to node 33 by connection 35. Capacitance 22 has first electrode 22-1 coupled to node 33 and second electrode 22-2 coupled to reference terminal or node 29. Inductance 24 is coupled between node 33 and control (e.g., "gate") terminal 30 of transistor 21. Common (e.g. "source") terminal 31 of transistor 21 is coupled to reference terminal or node 29. Output (e.g., "drain") terminal 32 of transistor 21 is coupled to node 34 which is in turn coupled to output terminal 28 of amplifier 26 via connection 36 and to a first terminal of inductance 25 via connection 37. A second terminal of inductance 25 is coupled to first terminal 23-1 of capacitance 23 whose second terminal 23-2 is coupled to reference terminal or node 29.

Figure 2:
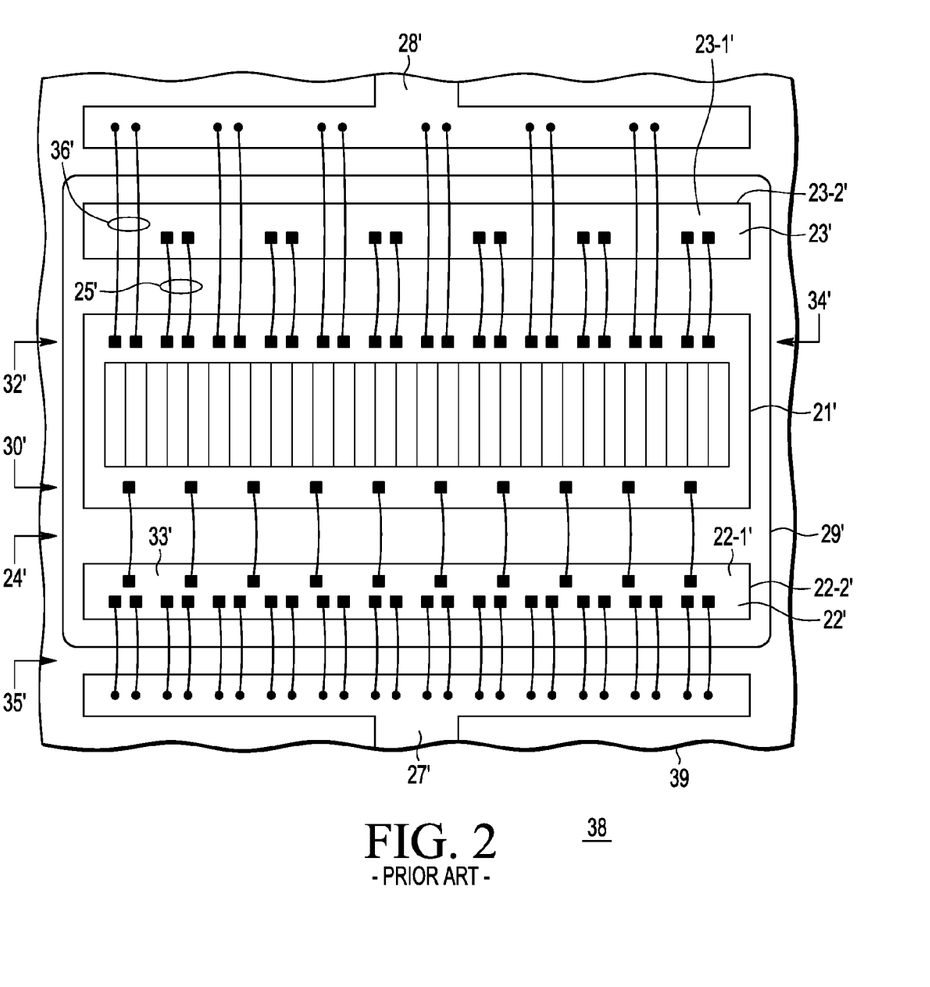
FIG. 2 is a simplified plan view of a physical amplifier structure embodying the circuit of FIG. 1, according to the prior art.

FIG. 2 shows a simplified plan view of physical amplifier structure 38 corresponding to circuit 26 of FIG. 1, according to the prior art. To facilitate correlation between structure 38 and circuit 26, the convention is followed of identifying corresponding elements in structure 38 with the same reference number used for such elements in FIG. 1 with a prime (') added to distinguish between the physical element and its representation in the electrical schematic of FIG. 1. Prior art amplifier structure 38 is assembled on conductive (e.g., metal) ground plane 29' on circuit board 39. Ground plane 29' corresponds to reference node 29 of FIG. 1. Amplifier structure 38 comprises separately formed elements, that is, capacitor 22', amplifying semiconductor device 21', capacitor 23' and various wirebonds that provide inductances 24, 25 and connections 35, 36, 37, etc. Capacitor 22', corresponding to capacitance 22 of FIG. 1, has its lower electrode 22-2' coupled to ground plane 29' and upper electrode 22-1' available to serve as node 33. Semiconductor device 21' (e.g., an LDMOS transistor) corresponds to active device 21 of FIG. 1. The internal structure of semiconductor device 21' is illustrated only schematically in FIG. 2 and can comprise for example, multiple parallel coupled source, drain and gate regions, represented schematically by the multiple rectangular regions shown therein. Capacitor 23' corresponding to capacitance 23 of FIG. 1 has lower electrode 23-2' coupled to ground plane 29' and upper electrode 23-1' available to be coupled to wirebonds 25'.

Wirebonds 35' correspond to connection 35 between input terminal 27' and node 33' formed by upper electrode 22-1' of capacitor 22'. Wirebonds 24' extend between upper terminal 22-1' of capacitor 22' and input (e.g., "gate") terminal(s) 30' of LDMOS transistor 21' and provide inductance 24 of FIG. 1. Wirebonds 25' extend between node 34' coupled to drain terminal(s) 32' of transistor 21' and upper electrode 23-1' of capacitance 23', and provide inductance 25 of FIG. 1. Wirebonds 36' extend between node 34' coupled to drain terminal(s) 32' of transistor 21' and output terminal or bus 28', and correspond to connection 36 of FIG. 1. Structure 38 illustrates a physical embodiment of circuit 26 of FIG. 1, according to the prior art. While structure 38 is useful, it is formed from separately produced active and passive components (e.g., transistor 21', capacitors 22', 23 and wirebond inductors 24', 25') and fails to realize economies of manufacture, improved reliability and performance, etc., that might be expected from an entirely monolithic structure formed using a coherent manufacturing technology.

It has been found that the failure of prior art structures and manufacturing technologies to provide monolithic implementations of circuit 26 of adequate performance at microwave frequencies arises, among other things, because of the degraded quality ("Q") factors associated with the passive components, e.g., the capacitors, inductors and interconnections when they are formed on a common SC substrate. It has been further found that such degraded Q factors arise, among other things, because of the adverse interaction between monolithic planar inductors formed on such SC substrate surface and the underlying SC substrate in or on which the active device(s) are also formed. This occurs because of the significant penetration of the electro-magnetic (EM) fields of such planar inductors and interconnections into the substrate, and merely adding or thickening dielectric layers between such planar inductors and interconnections and the underlying SC substrate and/or providing electrostatic shielding therebetween does not alleviate the problem. It has also been found that in addition to minimizing parasitic substrate inductive coupling effects, it is also important to minimize resistance of the various leads, inductors, and capacitor and ground connections since they can likewise adversely affect the overall Q and circuit performance. These and other problems associated with the prior art are minimized or avoided by the embodiments described below.

Figure 3:
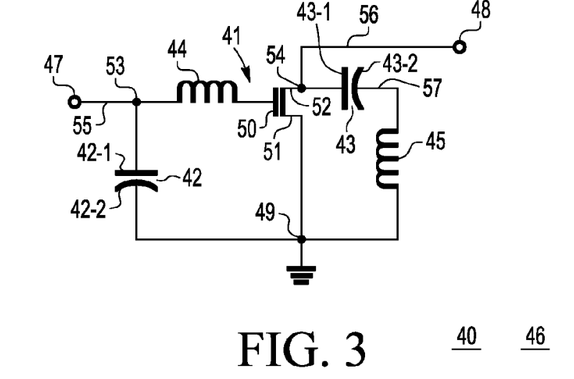
FIG. 3 is a simplified electrical schematic diagram of an insulated gate field effect transistor combined with capacitors and inductors to form a microwave amplifier, according to an embodiment of the present invention.

FIG. 3 shows simplified electrical schematic circuit 40 of IGFET 41 combined with capacitances 42, 43 and inductances 44, 45 to form microwave amplifier 46 having input terminal 47, output terminal 48 and reference terminal or node 49, according to an embodiment of the present invention. For convenience of description, terminal or node 49 may also be referred to as "ground" (abbreviated as "GND"), irrespective of whether or not an earth connection is provided. Input terminal 47 is coupled to node 53 by connection 55. Capacitance 42 has first electrode 42-1 coupled to node 53 and second electrode 42-2 coupled to reference terminal or node 49. Inductance 44 is coupled between node 53 and control (e.g., "gate") terminal 50 of transistor 41. Common (e.g. "source") terminal 51 of transistor 41 is coupled to reference terminal or node 49. Output (e.g. "drain") terminal 52 of transistor 41 is coupled to node 54 which is in turn coupled to first terminal 43-1 of capacitance 43 and also to output terminal 48 of amplifier 46 via connection 56. Second terminal 43-2 of capacitance 43 is coupled to a first terminal of inductance 45 via connection 57. A second terminal of inductance 45 is coupled to reference terminal or node 49.

Figure 4:
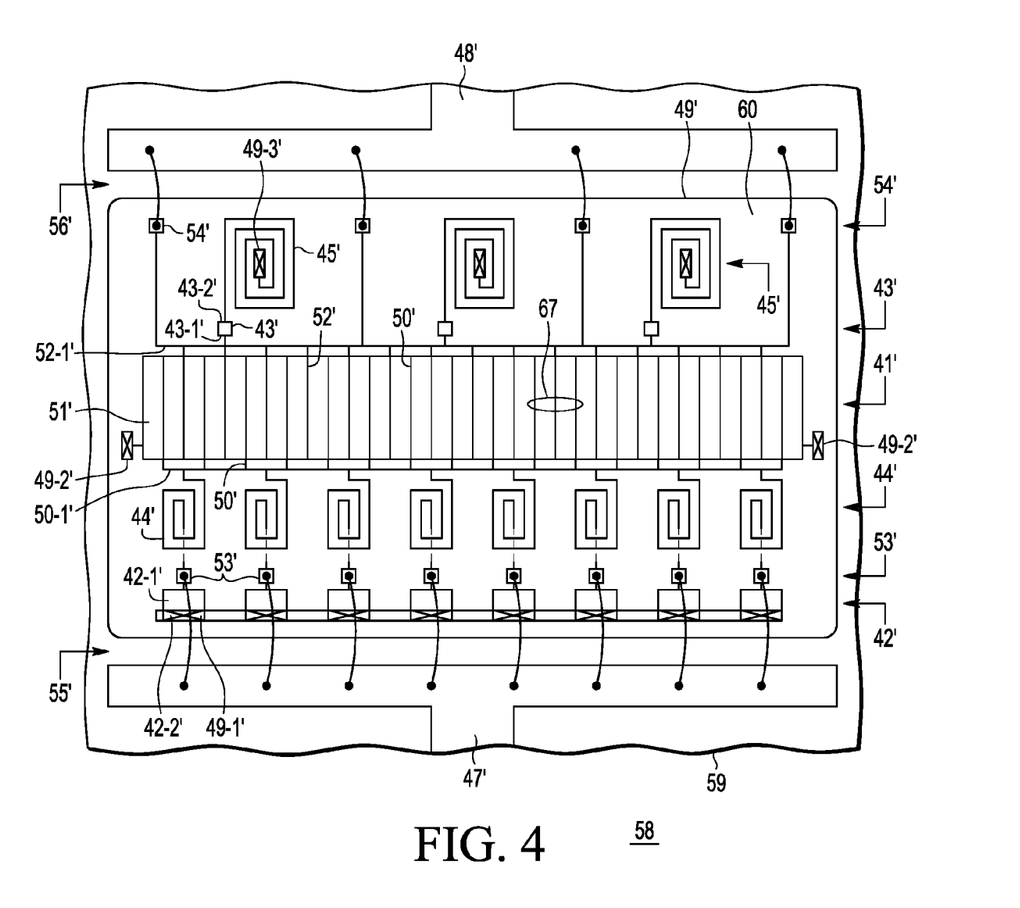
FIG. 4 is a simplified plan view of a physical amplifier structure embodying the circuit of FIG. 3, according to a further embodiment of the present invention.

FIG. 4 is a simplified plan view of physical amplifier structure 58 embodying circuit 46 of FIG. 3, according to a further embodiment of the present invention. To facilitate correlation between structure 58 and circuit 46, the convention is followed of identifying corresponding elements in structure 58 with the same reference number as used for such elements in FIG. 3 with a prime (') added to distinguish between the physical element and its representation in the electrical schematic of FIG. 3. Structure 58 of FIG. 4 illustrates by way of example, monolithic substrate 60 in or on which are formed: (i) exemplary LDMOS transistor 41' having multiple (e.g., 16) parallel segments, (ii) multiple (e.g., 8) capacitors 42', (iii) multiple (e.g., 3) capacitors 43', (iv) multiple (e.g., 8) inductors 44', and (v) multiple (e.g., 3) inductors 45', all formed on monolithic substrate 60 prior to being assembled on circuit board or heat sink 59. Transistor 41', capacitors 42', 43', and inductors 44', 45' of FIG. 4 correspond, respectively, to transistor 41, capacitances 42, 43 and inductances 44, 45 of FIG. 3. The combinations of (e.g., 8) capacitors 42' and inductors 44', are arranged substantially in parallel at the input of transistor 41'. The combinations of (e.g., 3) capacitors 43' and inductors 45', are arranged substantially in parallel at the output of transistor 41'. It will be understood by those of skill in the art, that the number of substantially parallel coupled segments of transistor 41' and/or the number of substantially parallel coupled capacitor-inductor combinations 42', 44', and/or 43', 45' may be varied to achieve different power handling capacities or circuit performance or manufacturing convenience or other reasons, and that the particular representations illustrated here is merely by way of example and not intended to be limiting.

Amplifying structure 58 of FIG. 4 differs from amplifying structure 38 of FIG. 2 by, among other things, having its passive and active elements formed on common SC substrate 60 manufactured using, for example, substantially planar integrated circuit processing technology. It will be understood by those of skill in the art that various insulating layers may be provided between such passive elements and underlying SC substrate 60 and reference to various elements being "on substrate 60" or "on the SC substrate" or equivalent includes having such insulating layers between such elements and underlying SC substrate 60.

Completed substrate 60 of FIG. 4 is installed as a unit on underlying circuit board or heat sink 59, rather than having its passive and active elements produced separately and later assembled and electrically coupled on circuit board 39 as in FIG. 2. Amplifying structure 58 of FIG. 4 comprises monolithic substrate 60 in which the desired active (e.g., transistor 41') and passive elements (e.g., capacitors 42', 43' and inductors 44', 45') are already included. It will be understood by those of skill in the art that the active device(s) (e.g., transistor 41') may be formed on or over substrate 60 or entirely within substrate 60 or partly within and partly on or over substrate 60, depending upon the nature of the device(s). Accordingly, as used herein with respect to the active device(s), the terms "in substrate 60", "in the SC substrate" and equivalents are intended to include all such variations. It has been found, among other things, that when the bulk resistivity of SC substrate 60 is equal or greater than a predetermined level, that the parasitic inductor-substrate coupling can be substantially reduced and the inductor Q increased enough that satisfactory circuit performance can be obtained, even though the inductors are in the form of planar coils supported by the SC substrate. The desirable predetermined level is usefully equal or greater then about 100 Ohm-cm resistivity, conveniently equal or greater than about 500 Ohm-cm resistivity, more conveniently equal or greater than about 1000 Ohm-cm resistivity and preferably of float zone material of about 1000 Ohm-cm or greater resistivity. As used herein, the term "bulk resistivity" refers to those portions of substrate 60 that lie outside the device regions, e.g., outside transistor 41' and its associated doped regions. This is a result not taught in the prior art.

Figure 5:
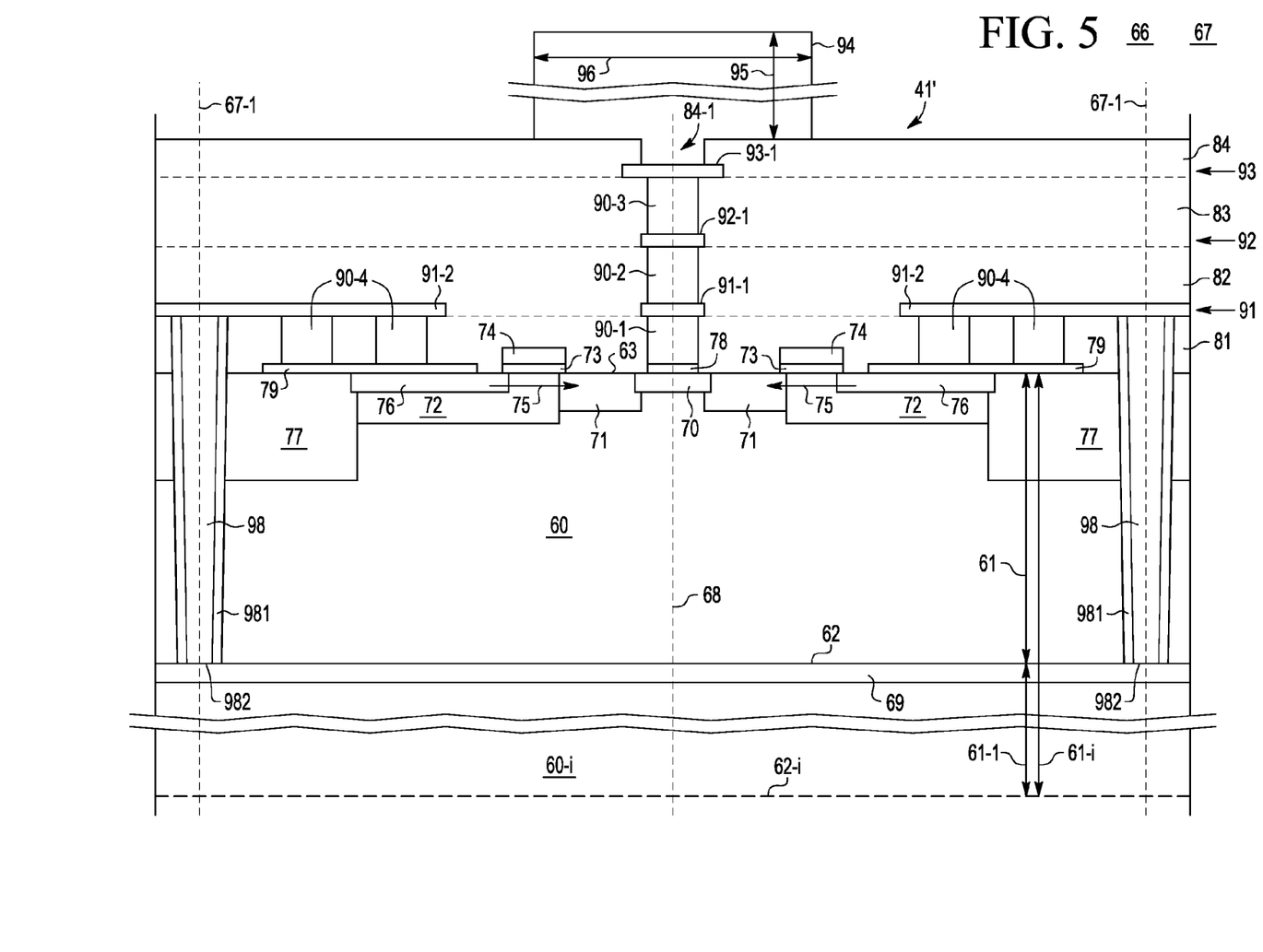
FIG. 5 is a simplified cross-sectional view of a lateral (double) diffused metal-oxide-semiconductor (LDMOS) transistor useful in the amplifier of FIGS. 3-4, according to a still further embodiment of the invention.
Figure 6:
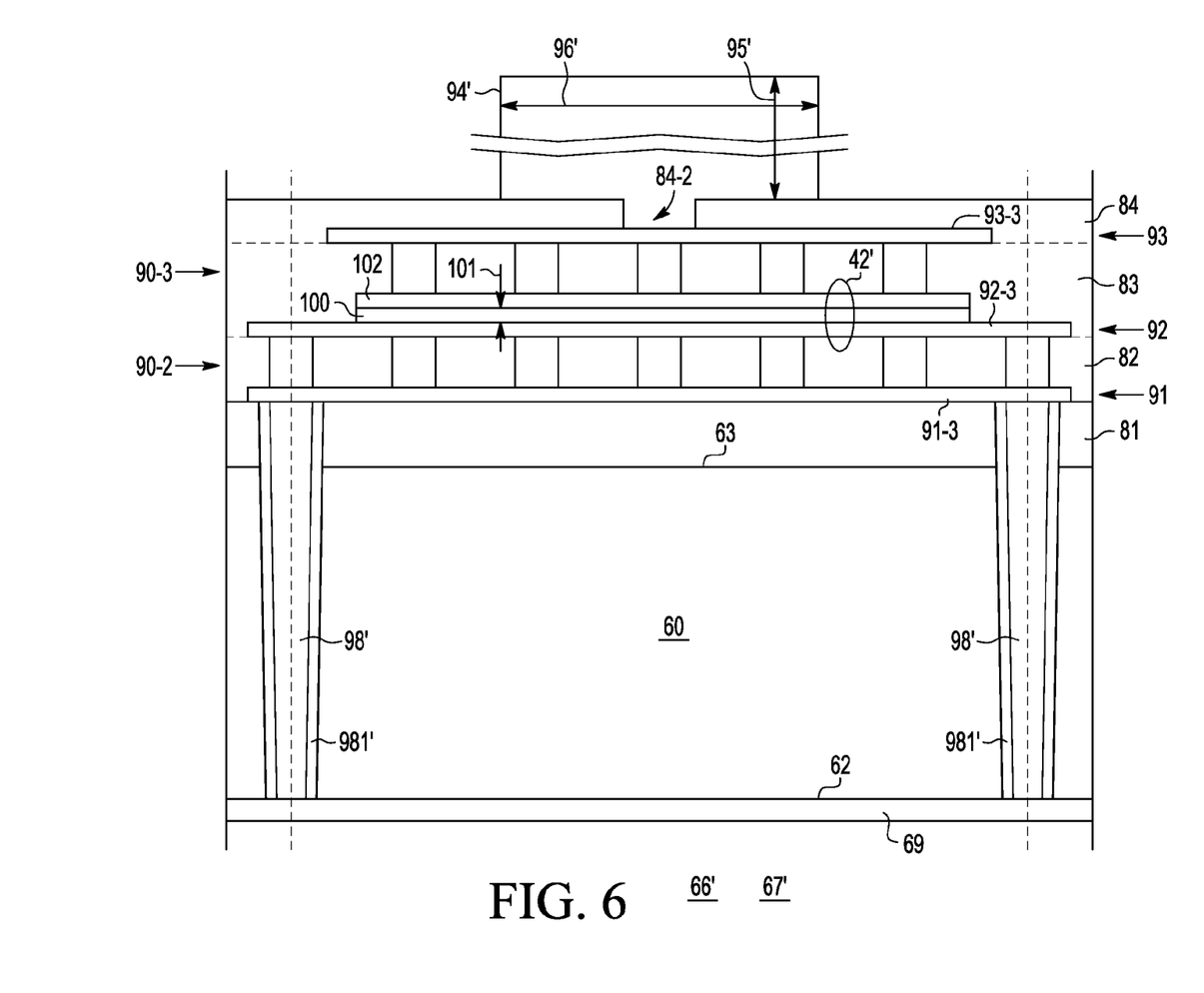
FIG. 6 is a simplified cross-sectional view of a portion of the amplifier structure of FIG. 4 illustrating how low loss capacitance is provided therein in a monolithic form, coupled to conductors useful for forming low loss inductances or interconnections as a part of the same monolithic structure, according to a yet further embodiment of the invention.

Monolithic substrate 60 containing, for example, transistor 41', planar capacitors, 42', 43' and planar inductors 44', 45' is mounted as a unit on underlying circuit board or heat sink 59, and the appropriate nodes thereon electrically coupled (e.g., via wirebonds 55') to input bus 47' corresponding to input terminal 47 of FIG. 3 and coupled (e.g., via wirebonds 56') to output bus 48' corresponding to output terminal 48 of FIG. 3. As will be subsequently explained in more detail in connection with FIGS. 5-7, reference or ground plane 49' corresponding to reference or ground node 49 of FIG. 3 underlies a portion or all of substrate 60. Numerous through-substrate-via (TSV) connections (e.g., 49-1', 49-2', 49-3', etc.) are desirably provided in substrate 60 leading to reference or ground plane 49' to minimize series resistance, reduce losses and enhance overall circuit performance. Exemplary details of such TSV connections are illustrated in FIGS. 5-6. It will also be understood that transistor structure 41' illustrated only schematically in FIG. 4, can comprise many parallel segments. For example, 16 such segments are shown in FIG. 4. In the case of exemplary LDMOS transistor 41' these segments include multiple source regions 51' parallel coupled to reference electrode 49', drain regions 52' parallel coupled to drain bus 52-1', and intervening gate fingers 50' parallel coupled to gate bus 50-1'. As is illustrated in more detail in FIG. 5, common (e.g., source) regions 51' of transistor 41' are coupled at multiple locations to ground plane or reference electrode 49' underlying substrate 60 using various TSVs, indicated symbolically by TSVs 49-2' in FIG. 4.

Wirebonds 55' extending from input bus 47' (corresponding to input terminal 47 of FIG. 3) to bonding pads (e.g., node) 53' correspond to connection 55 to node 53 of FIG. 3. Upper terminal 42-1' of (e.g., planar) capacitor 42' is coupled to node 53' and lower terminal 42-2' of capacitor 42' is coupled via TSV 49-1' to ground plane 49' underlying substrate 60. Inductor (e.g., planar coil) 44' corresponding to inductance 44 of FIG. 3 has one terminal coupled to node 53' and a second terminal coupled to gate bus 50-1' which ties together multiple gates 50' of exemplary LDMOS transistor 41'.

Planar capacitor 43' corresponding to capacitance 43 of FIG. 3 has, for example, upper electrode 43-1' coupled to drain bus 52-1' and lower electrode 43-2' coupled to a first lead of planar inductor 45' corresponding to inductance 45 of FIG. 3, or vice-versa. A second lead of planar inductor 45' is coupled via TSV 49-3' to ground plane 49' underlying all or a portion of substrate 60. Drain bus 52-1' is also coupled to bonding pad 54' corresponding, for example, to node 54 of FIG. 3. Wirebonds 56' corresponding to connection 56 of FIG. 3 couple bonding pad 54' to output bus 48' corresponding to output terminal 48 of FIG. 3. In the arrangement illustrated in FIGS. 3-4: (i) capacitance 43 (capacitor 43') and inductance 45 (inductor 45') are serially coupled, (ii) capacitance electrode 43-1 (capacitor electrode 43-1') is connected to node 54, 54', and (iii) a lead of inductance 45 (inductor 45') is connected to reference node 49 (ground plane 49'). However, in other embodiments, the order of these elements may be reversed, so that while capacitance 43 (capacitor 43') and inductance 45 (inductor 45') are still serially coupled, a lead of inductance 45 (inductor 45') is connected to node 54, 54' and a lead of capacitance 43 (capacitor 43') is connected to reference node 49 (ground plane 49'). Either arrangement is useful.

Among other things, amplifying structure 58 of FIG. 4 has the advantage that the various passive and active devices are provided in monolithic (e.g., planar) form and can be assembled onto circuit board or heat sink 59 as part of monolithic unit 60 rather than being manufactured and interconnected separately. This leads to several beneficial results. First: the number of wire-bonds and similar connections needed to implement circuit 46 is much smaller with the arrangement of FIG. 4 versus the arrangement of circuit 26 of FIG. 2. It is well known in the art that overall reliability improves as the number of separately provided interconnections is reduced. Second: the ability to use substantially planar integrated circuit processing technology to manufacture both passive and active elements on a common substrate means that assembly of the individual passive and active elements can be avoided. This is well known to lead to reduced manufacturing cost and improved overall performance. Thus, the arrangement illustrated in FIGS. 3-4 makes it possible to utilize such technologies and overcomes the limitations of the prior art relying on individually manufactured and assembled elements.

FIG. 5 shows simplified cross-section 66 though portion 67 of lateral (double) diffused metal-oxide-semiconductor (LDMOS) transistor 41' useful in the amplifier structure of FIGS. 3-4, according to a still further embodiment of the invention. In a preferred embodiment, portion 67 is substantially laterally symmetrical around centerline 68 of portion 67, but in other embodiments a non-symmetric structure may also be used. Dashed lines 67-1 indicate where portion 67 mates with substantially identical portions on either side thereof to form multi-segment LDMOS transistor 41'. FIG. 5 depicts initial substrate 60-$i$ having initial thickness 61-$i$ and initial lower surface 62-$i$ (shown dashed) prior to a substrate thinning operation (discussed later) and also shows subsequent substrate 60 of thickness 61 and with lower surface 62 after such thinning operation in which portion 61-1 of initial substrate 61-$i$ has been removed. Portion 67 comprises (e.g., P type) high resistivity SC substrate 60-$i$, 60 having a resistivity usefully equal or greater than about 100 Ohm-cm resistivity, conveniently equal or greater than about 500 Ohm-cm resistivity, more conveniently equal or greater than about 1000 Ohm-cm resistivity, and preferably of float zone material of at least about 1000 Ohm-cm resistivity. Finished thickness 61 of substrate 60 is usefully in the range of about 10 to 1000 micrometers, conveniently in the range of about 25 to 500 micrometers, and desirably in the range of about 50 to 150 micrometers with about 75 micrometers being preferred, but thicker and thinner substrates may also be used. Lower surface 62 of substrate 60 is desirably provided with conductor 69 of, for example, gold (Au), corresponding to reference node 49 of FIG. 3 and ground plane 49' of FIG. 4. Other relatively conductive materials besides Au may also be used for conductor 69, depending upon the die attach method chosen for assembly of substrate 60 to circuit board or heat sink 59. Attachment to a heat sink is preferred. Conductor 69 may underlie all or part of substrate 60. Overlying upper surface 63 of substrate 60 are several dielectric and conductor layers and regions, as for example, "first" dielectric layer 81 overlain in part by "first metal" layer 91, "second" dielectric layer 82 overlain in part by "second metal" layer 92, "third" dielectric layer 83 overlain in part by "third metal" layer 93 and "fourth" dielectric layer 84 overlain in part by "fourth metal" layer 94. As used herein the term "metal" is intended to include any type of relatively electrically conductive material (e.g., layered conductor structures, metal-SC compounds, semimetals, etc.) and not be limited merely to simple metals. The structure presented in FIG. 5 is intended by way of example and not limitation and depending upon the particular circuit being implemented, more or fewer dielectric-metal layer combinations may be provided.

In a symmetric structure, drain region 70 (e.g., N+) is preferably provided around centerline 68 adjacent surface 63 substantially centrally located in portion 67, but other locations and non-symmetric arrangements may also be used. Drain region 70 has doping concentration usefully at least about $5E19$ $cm^{-3}$, conveniently at least about $1E20$ $cm^{-3}$ and preferably at least about $3E20$ $cm^{-3}$, but higher or lower doping concentrations may also be used. Laterally abutting drain region 70 in a symmetric structure are (e.g., high-voltage-N type (HVN)) carrier drift regions 71. Carrier drift regions 71 have doping concentration usefully in the range of about $1E16$ $cm^{-3}$ to $1E18$ $cm^{-3}$, conveniently in the range of about $7E16$ $cm^{-3}$ to $3E17$ $cm^{-3}$, and preferably in the range of about $1E17$ $cm^{-3}$ to $2E17$ $cm^{-3}$, but higher or lower doping concentrations may also be used. Laterally outboard of drift regions 71 are (e.g., P type-high-voltage (PHV)) channel regions 72 underlying at least a portion of gate dielectric 73 and conductive gate 74. Channel regions 72 have doping concentration usefully in the range of about $1E17$ $cm^{-3}$ to $2E18$ $cm^{-3}$, conveniently in the range of about $3E17$ $cm^{-3}$ to $1E18$ $cm^{-3}$, and preferably in the range of about $5E17$ $cm^{-3}$ to $9E17$ $cm^{-3}$, but higher or lower doping concentrations may also be used. Laterally outboard of channel regions 72 are (e.g., N+) source regions 76. Source regions 76 have doping concentration usefully at least about $5E19$ $cm^{-3}$, conveniently at least about $1E20$ $cm^3$ and preferably at least about $3E20$ $cm^{-3}$, but higher or lower doping concentrations may also be used. Laterally outboard of source regions 76 are (e.g., P type) body contact regions 77. Body contact regions 77 have doping concentration usefully in the range of about $1E18$ $cm^{-3}$ to $1E20$ $cm^{-3}$, conveniently in the range of about $2E18$ $cm^{-3}$ to $7E19$ $cm^{-3}$, and preferably in the range of about $5E18$ $cm^{-3}$ to $5E19$ $cm^{-3}$, but higher or lower doping concentrations may also be used. When gate 74 is appropriately bias, conductive channel 75 forms between source region 76 and drain region 70. The exemplary conductivity types presented above are suitable for forming an N-channel structure, but persons of skill in the art will understand that a P-channel structure can also be formed by appropriate interchange of conductivity type of the various doped regions and appropriate modification of the bias on gate 74. The thickness of gate dielectric 73 will depend upon the desired operating voltage, but thicknesses in the range of about 10 to 1000 nanometers are useful, about 100 to 500 nanometers are convenient and about 150 to 400 nano-meters are preferred. WSi is useful for gate conductor 74, but other conductive materials may also be used. Persons of skill in the art will understand that gate conductors 74 are coupled to gate contacts 50 (see FIG. 4) and gate bus 50-1 in planes before and/or behind the plane of FIG. 5.

Overlying and making Ohmic contact to drain region 70 is conductor 78, for example of cobalt-silicide, but other conductive materials may also be used. Overlying and making Ohmic contact to drain contact region 78 is interlayer conductive via 90-1 extending through first dielectric layer 81 so as to electrically couple drain contact region to portion 91-1 of first metal 91. Overlying and making Ohmic contact to portion 91-1 of first metal 91 is interlayer conductive via 90-2 extending through second dielectric layer 82 so as to electrically couple portion 91-1 of first metal 91 to portion 92-1 of second metal 92. Overlying and making Ohmic contact to portion 92-1 of second metal 92 is interlayer conductive via 90-3 extending through third dielectric layer 83 so as to electrically couple portion 92-1 of second metal 92 to portion 93-1 of third metal 93. Opening 84-1 is provided in fourth dielectric layer 84 so as to permit fourth metal 94 to make Ohmic contact to portion 93-1 of third metal 93. While the multi-layer dielectric-metal arrangement illustrated in FIG. 5 is preferred, any means for providing relatively low resistance connection between drain contact 78 and overlying metal conductor 94 may be used. Metal layers 91, 92, 93, are conveniently of an aluminum-copper (Al—Cu) alloy, for example and not intended to be limiting, of ~99.5% Al and ~0.5% Cu, and with thickness usefully of about 0.1 to 10 micrometers, conveniently in the range of about 0.3 to 3 micrometers and preferably in the range of about 0.5 to 0.7 micrometers, but thinner or thicker layers and other conductive materials may also be used.

Overlying and making Ohmic contact to source regions 76 and body contact regions 77 are conductors 79, for example of cobalt-silicide, but other conductive materials may also be used. Interlayer conductive vias 90-4 are provided extending through dielectric layer 81 so as to Ohmically couple source-body contacts 79 to portions 91-2 of first metal layer 91, which are in turn Ohmically coupled to through-substrate-vias (TSVs) 98 extending through substrate 60 to provide comparatively low electrical resistance contact to ground plane layer 69 underlying substrate 60. Tungsten (W) is a suitable material for the conductor of TSVs 98. In other embodiments, dielectric liner 981 provided in TSVs 98 between the central conductor (e.g., tungsten (W)) and the surrounding SC (e.g., silicon (Si)) may be omitted. Either arrangement is useful. As noted above, "metal" layers 91, 92, 93 are conveniently of aluminum-copper (Al—Cu) alloy, but other relatively electrically conductive materials may also be used. Interlayer vias 90-1, 90-2, 90-3, 90-4 are conveniently also of tungsten (W) but other conductive materials may also be used. Dielectric layers 81, 82, 83, 84 are conveniently of silicon oxide or silicon nitride or combinations thereof, but other relatively low leakage dielectric material may also be used. Dielectric layers 81, 82, 83, 84 are usefully of thickness in the range of about 0.1 to 10 micrometers, conveniently in the range of about 0.5- to 5 micrometers and preferably in the range of about 1 to 1.5 micrometers, but thinner or thicker layers may also be used. Conductor 94 coupled to drain contact 78 is desirably of copper (Cu), gold (Au), silver (Ag) or combinations thereof, or other high conductivity metal or alloy, with ~99% pure Cu preferred. Conductor 94 is conveniently also used to form, for example, inductors 45' of FIG. 4 and other top surface interconnections, especially those carrying drain current. For that reason it is desirably that its resistance is low. Accordingly, in a preferred embodiment, thickness is usefully at least about 1 micrometer, conveniently at least about 3 micrometers, more conveniently at least about 6 micrometers and preferably at least about 9 micrometers. Stated another way, it is generally desirable that thickness 95 of conductor 94 (and conductors 94', 94" discussed subsequently) be 5 to 10 times the thickness of first, second or third metal layers 91-93, but other thicknesses may also be used. Width 96 of conductor 94 is desirably chosen to minimize the resistance of conductor 94 taking into account the available surface area on substrate 60 for forming, for example, inductors 45' and other (e.g., drain current) interconnections, for example, those leading to bonding pads 54' (see FIG. 4).

FIG. 6 shows simplified cross-sectional view 66' of portion 67' of amplifier structure 58 of FIG. 4 illustrating how low loss capacitance is provided therein on SC substrate 60 in a monolithic form, coupled to conductors useful for forming low loss inductances and interconnections on the same monolithic substrate 60, according to a yet further embodiment of the invention. Portion 67' depicts the same substrate 60 as illustrated in FIG. 5 but at a different location from transistor 41', for example where capacitances 42' or 43' of FIG. 4 are intended to be provided. For convenience of explanation, the cross-sectional structure of capacitor 42' having one electrode coupled to ground plane 69 (i.e., reference node 49, 49' of FIGS. 3-4) is depicted by way of example and not limitation. The same reference numbers are used in FIG. 6 as in FIG. 5 with the addition of a prime (') or double-prime (") followed by "-n", where n is a number different than used in FIG. 5. This is intended to indicate for example, that the illustrated elements can be formed in the same layers and at the same time as the corresponding elements in FIG. 5, but may be located in different lateral positions and establish different interconnections. Accordingly, the discussion of FIG. 5 with respect to the composition and thickness of the various conductor and dielectric layers or regions is incorporated herein by reference.

In exemplary structure 67' of FIG. 6, capacitor 42' is formed using portion 92-3 of "second metal" layer 92 as lower electrode 42-2' of capacitor 42'. Dielectric layer 100 is provided on conductor portion 92-3 and upper electrode 102 corresponding to upper electrode 42-1' of FIG. 4 is provided overlying dielectric layer 100. Silicon oxide and/or silicon nitride and/or combinations thereof are non-limiting examples of suitable materials for dielectric layer 100, but other insulating materials may also be used. Thickness 101 of dielectric layer 100 will depend upon the desired capacitance and the voltage required to be sustained by capacitor 42'. In many applications, thickness 101 is usefully in the range of about 0.01 to 1 micrometers, conveniently in the range of about 0.1- to 0.5 micrometers and preferably in the range of about 0.15 to 0.25 micrometers, but thinner or thicker layers may also be used. Upper electrode 102 is conveniently of TiN and has thickness usefully in the range of about 0.01 to 1 micrometers, conveniently in the range of about 0.1 to 0.5 micrometers and preferably in the range of about 0.15 to 0.25 micrometers, but thinner or thicker layers and other conductors may also be used. Interlayer conductive vias 90-2 are provided to couple lower electrode 42-2' provided by portion 92-3 of "second metal" 92 to portion 91-3 of "first metal" 91, which is coupled to TSVs 98' which are in turn coupled to ground plane or other reference potential conductor 69 on rear surface 62 of monolithic SC substrate 60. In other embodiments, dielectric liner 981' where TSVs 98' pass through substrate 60 may be omitted. Either arrangement is useful. Interlayer conductive vias 90-3 couple upper electrode 42-1' of capacitor 42 provided by conductor 102 to portion 93-3 of "third metal" layer 93. Opening 84-2 is provided in fourth dielectric layer 84 so that low resistance conductor 94' of thickness 95' and width 96' analogous to conductor 94 of thickness 95 and width 96 of FIG. 5 may be provided to couple capacitor 42', for example, to inductor 44' and/or node 53' of FIG. 4. The above-described arrangement allows high quality (e.g., high Q) capacitances to be provided in planar form by minimizing resistive losses associated therewith and the connections thereto.

Figure 7:
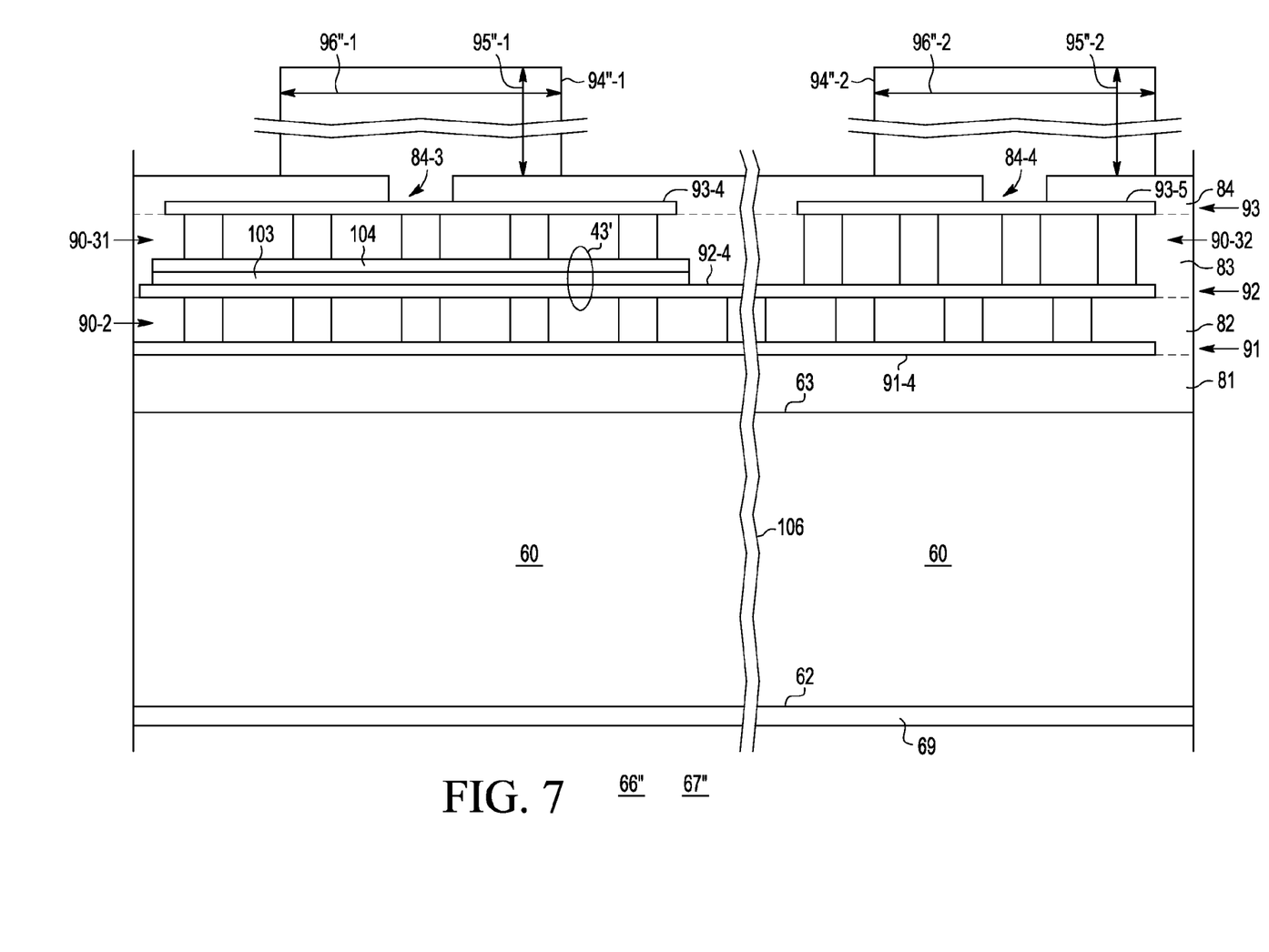
FIG. 7 is a simplified cross-sectional view of still another portion of the amplifier structure of FIG. 4 illustrating how another low loss capacitance is provided therein in a monolithic form, coupled to conductors useful for forming low loss inductances or interconnections as a part of the same monolithic structure, according to a still yet further embodiment of the invention.

While FIG. 6 illustrates capacitor 42' having one electrode coupled to reference potential through low resistance TSVs and another electrode coupled to a non-grounded node, persons of skill in the art will understand that by omitting interlayer conductive vias 90-2 coupling portion 92-3 to portion 91-3 tied to TSVs 98', that capacitor 43' of FIG. 4 having both electrodes coupled to non-grounded nodes may be provided. Such an arrangement is illustrated in FIG. 7, showing cross-section 66" of portion 67" wherein capacitor 43' is illustrated. Capacitor 43 has lower electrode (e.g., 43-2' of FIG. 4) formed by portion 92-4 of "second metal" 92, dielectric 103 thereon (of thickness similar to that of dielectric 100 of FIG. 6) and upper electrode (e.g. 43-1' of FIG. 4) 104 coupled by interlayer vias 90-31 to portion 93-4 of "third metal" 93, which is in turn coupled to heavier lead 94"-1 (analogous to lead 94, 94' previously described) via opening 84-3 in dielectric layer 84. However, rather than being coupled to TSVs 98' as in FIG. 6, portion 92-4 of "second metal" layer 92 is coupled through interlayer vias 90-32 to portion 93-5 of "third metal" layer 93 and heavier lead 94"-2 via opening 84-4 in dielectric layer 84. As indicated by break 106, heavier lead 94"-2 may be at any distance from and at any orientation with respect to lead 94"-1. Thus, the arrangement of FIG. 7 may be used to implement, for example, capacitor 43" that is series coupled between drain bus 52-1' and planar inductor 45' in FIG. 4, lead 94"-2 for example, going to drain bus 52-1' and lead 94"-1 going to planar inductor 45' or vice versa depending upon the preference of the designer. FIG. 7 also illustrates a further embodiment in which portion 91-4 of "first metal" layer 91 is provided underlying and coupled by interlayer conductive vias 90-2 to portion 92-4 of "second metal" layer 92, so that it is electrically in parallel with portion 92-4, thereby reducing the resistance between capacitor 43" and lead 94"-2. This reduces parasitic resistance and facilitates providing a high Q value for capacitor 43" and for inductor 45'.

Figure 8:
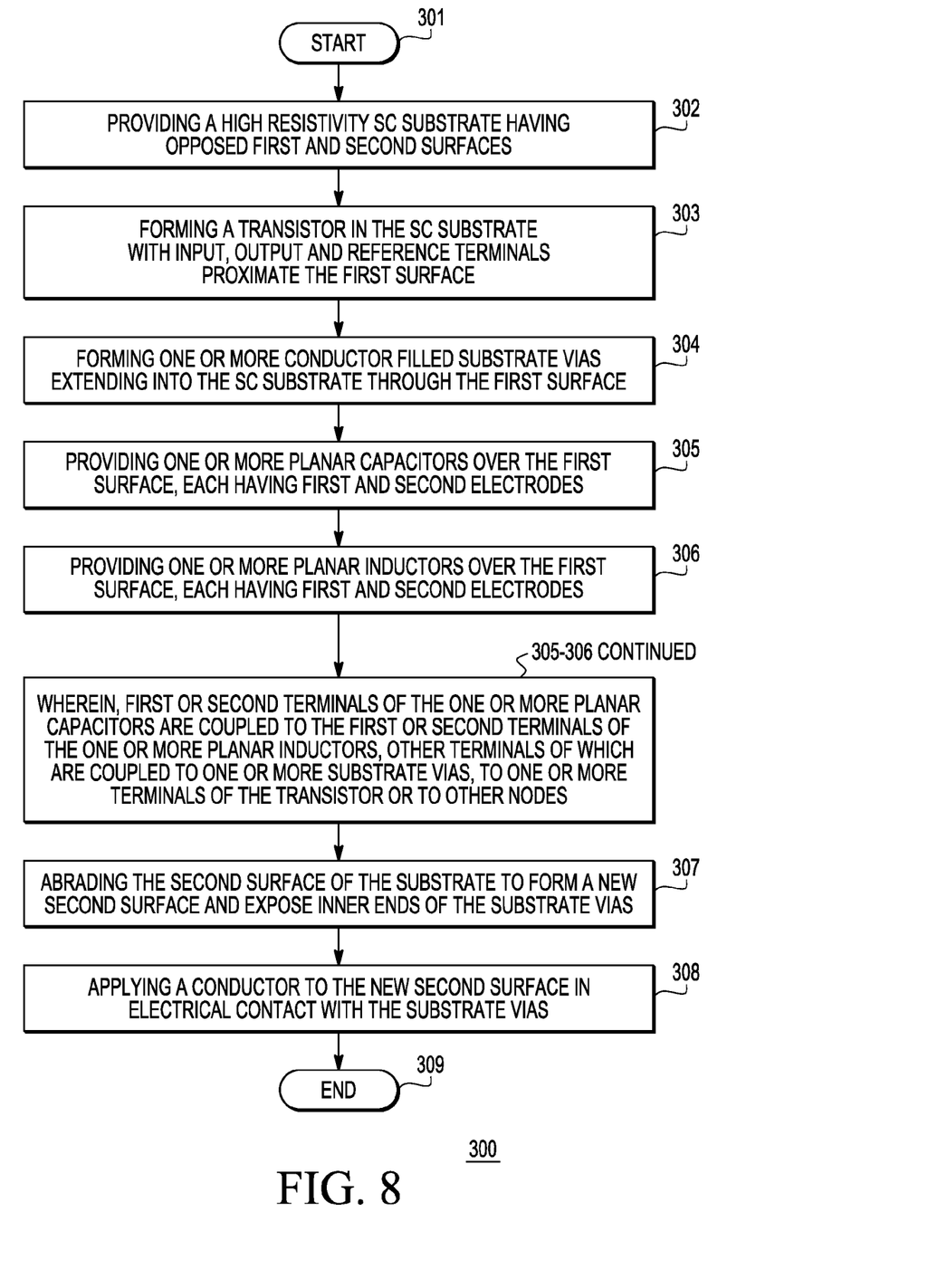
FIG. 8 shows a simplified flow chart illustrating a method for forming part or all of the structures of FIGS. 4-7, according to yet still further embodiments of the invention.

FIG. 8 shows a simplified flow chart illustrating method 300 for forming part or all of the circuit and structures of FIGS. 3-7, according to yet still further embodiments of the invention. It will be understood by those of skill in the art that while method 300 is useful for forming all or part of the circuit and structures illustrated in FIGS. 3-7, it can also be used to form other circuits and structures containing more or fewer capacitors, inductors and transistors and is not limited merely to implementing the circuit of FIG. 3. Following START 301, initial step 302 comprises providing a high (e.g., preferably $\geq 10^3$ Ohm-com) resistivity SC substrate having opposed first and second surfaces (63, 62-$i$). This substrate is referred to as initial substrate 60-$i$ having initial thickness 61-$i$ and initial lower surface 62-$i$ (see FIG. 5) to distinguish it from final substrate 60 of FIGS. 4-7 that has smaller thickness 61 and lower surface 62. Substrate 60-$i$ has an initial thickness at the beginning of manufacturing usefully in the range of about 500 to 1000 micrometers, conveniently in the range of about 600 to 900 micrometers, and preferably in the range of about 700 to 800 micrometers, but thicker and thinner substrates may also be used. Step 303 comprises forming a transistor (e.g., transistor 41') in the substrate (e.g., substrate 60-$i$) with input (e.g., gate 50, 50', 74) terminal, output (e.g., drain 52, 52', 70, 78) terminal and reference or common (e.g., source 51, 51', 76, 79) terminal, proximate the first surface (e.g., surface 63 of FIGS. 4-7). In step 304, one or more conductor filled substrate-vias (e.g., vias 49', 98, 98') are formed extending into the initial SC substrate (e.g., substrate 60-$i$) through the first surface (e.g., surface 63). Lower surfaces 982 (see FIG. 5) of such substrate-vias (e.g., vias 49', 98, 98') are initially buried within initial substrate (e.g., substrate 60-$i$) and not yet exposed. In step 305 one or more planar capacitors (e.g., capacitor 42', 43') are provided over the first surface (e.g., surface 63) of the initial substrate (e.g., substrate 60-$i$), each capacitor having first and second terminals. In step 306, one or more planar inductors (e.g., inductors 44', 45') are provided over the first surface (e.g. surface 63), wherein the first terminal (e.g., terminal 42-1', 43-1') or the second terminal (e.g., terminal 42-2, 43-2) of the one or more planar capacitors (42', 43') is coupled to the first terminal (e.g., terminal 44-1', 45-1') or the second terminal (e.g., terminal 44-2', 45-2') of the one or more planar inductors (44', 45'), other terminals of which (e.g., terminals 44-2', 44-1') are adapted to be coupled to substrate-vias (e.g., substrate vias 49', 98, 98'), to one or more terminals of the transistor (e.g., terminals 50', 52' of transistor 41'), or to other nodes (e.g., nodes 53, 54). In subsequent step 307, lower surface 62-$i$ (see FIG. 5) of the initial substrate (e.g., substrate 60-$i$) is lapped, etched and/or otherwise abraded to remove initial substrate thickness amount 61-1 (see FIG. 5) and expose lower (inner) ends (e.g., ends 982) of the substrate vias (e.g., vias 49, 98, 98'). In step 308, a conductor (e.g., ground plane conductor 49', 69) is applied to the newly exposed rear face (e.g., face 62) of the thinned substrate (e.g., substrate 60) so that the substrate vias (e.g., vias 49', 98, 98') are electrically connected to the ground plane conductor (e.g., conductor 49', 69). Method 300 then proceeds substantially to END 309.

According to a still additional embodiment, the preferred embodiment illustrated in FIG. 4, may be formed in steps 305-306 by: (a) in step 305 forming first and second planar capacitors (e.g., capacitor 42', 43') over the first surface (e.g., surface 63) of initial substrate 60-$i$, each capacitor having first and second terminals; (b) in step 306, forming first and second planar inductors (e.g., inductors 44', 45') over the first surface (e.g. surface 63), each inductor having first and second terminals; (c) coupling the first terminal (e.g., 42-1') of the first capacitor (e.g., capacitor 42') to a first terminal of the first inductor (e.g., inductor 44') and coupling the second terminal of the first inductor to the transistor input (e.g., gate 50'); (d) coupling the first terminal (e.g., terminal 43-1') of the second capacitor (e.g., capacitor 43') to the transistor output (e.g., drain 52') and the second terminal (e.g., terminal 43-2') of the second capacitor (e.g., capacitor 43') to the first terminal of the second inductor (e.g., inductor 45'); and (e) coupling the second terminal (42-3') of the first capacitor (e.g., capacitor 42'), the second terminal of the second inductor (e.g., inductor 45') and the common terminal (e.g., source 51') of the transistor (e.g., transistor 41') to the substrate vias (e.g., substrate vias 49', 98, 98').

Figure 9:
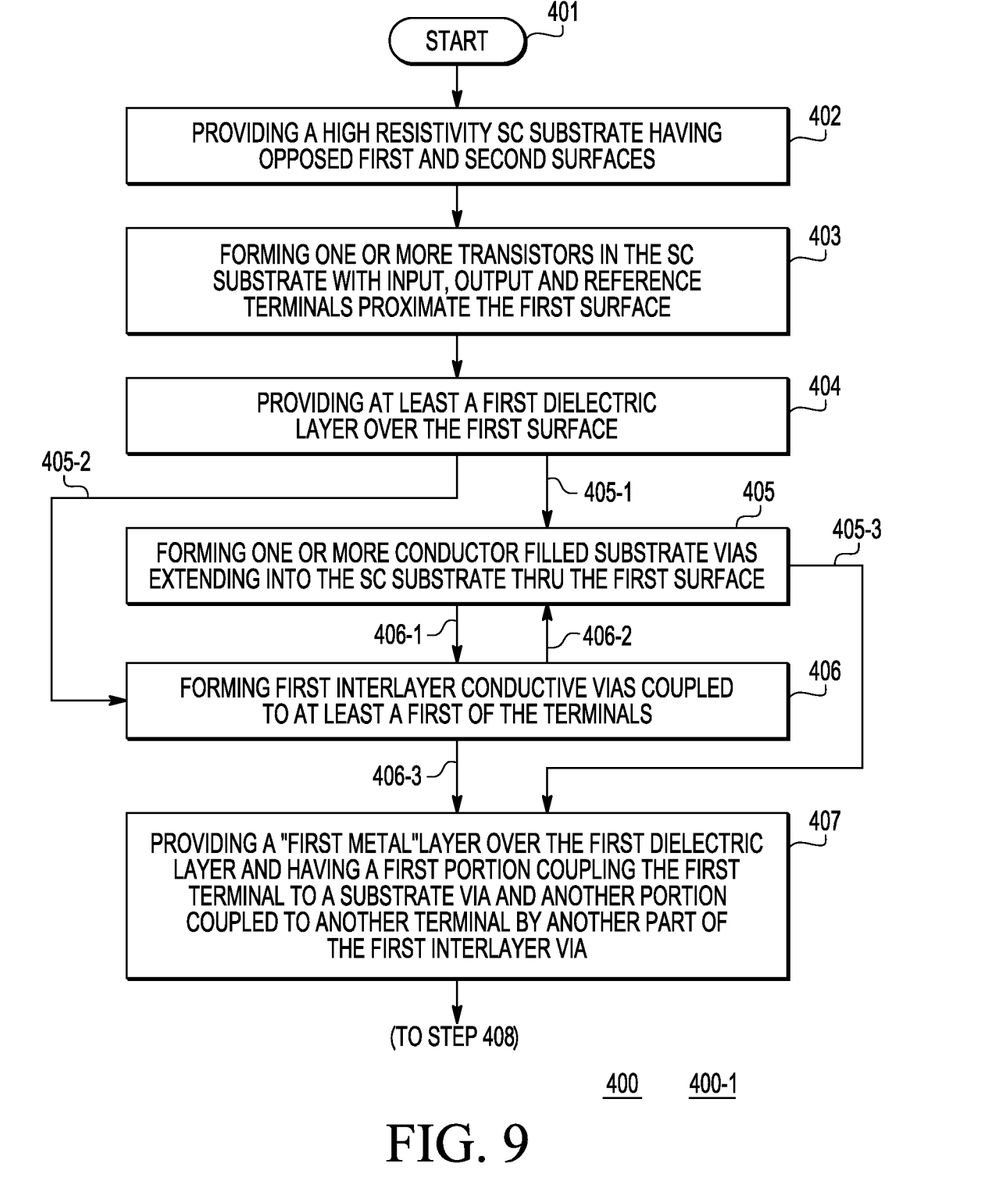
FIGS. 9-11 show a simplified flow chart illustrating a method for forming part or all of the structures of FIGS. 4-7, according to yet additional embodiments of the invention.
Figure 10:
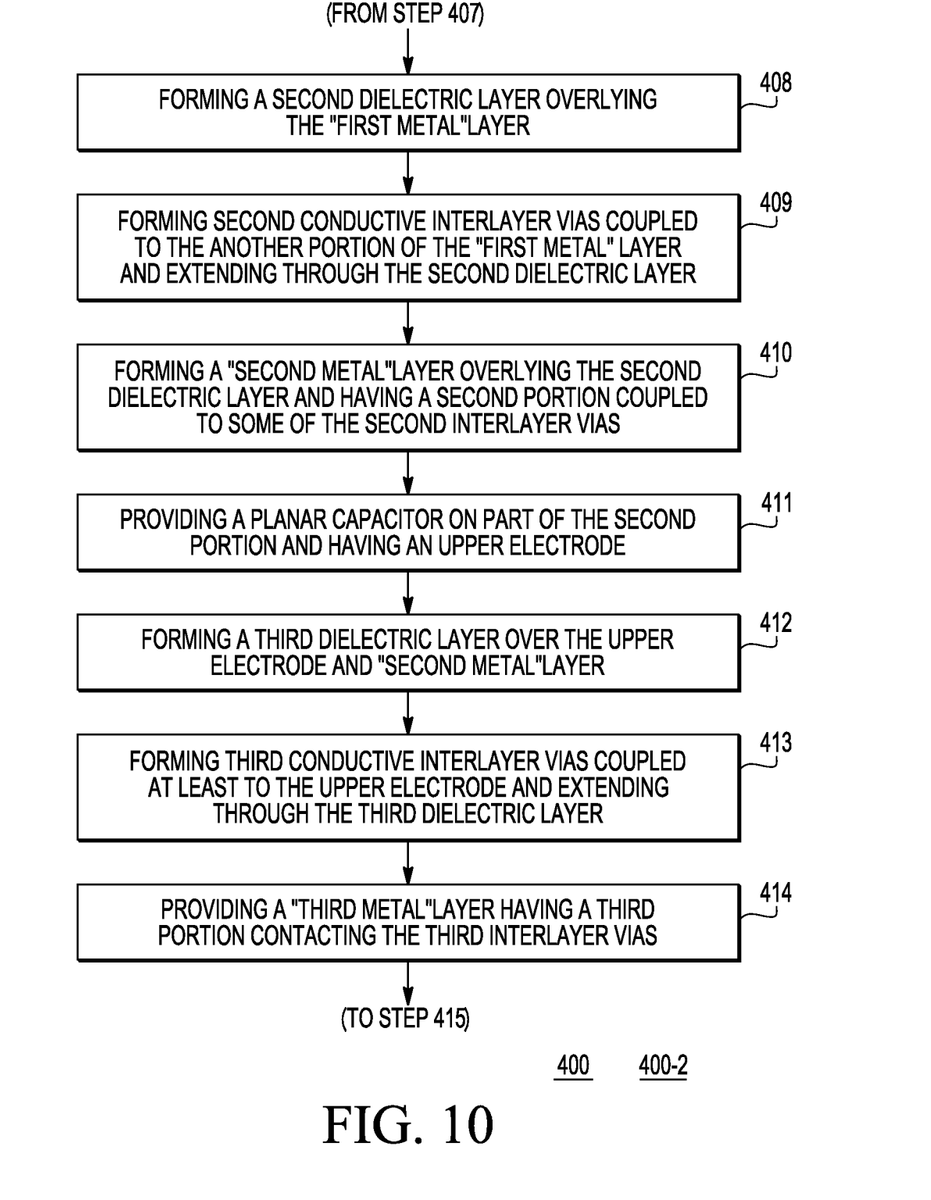
Figure 11:
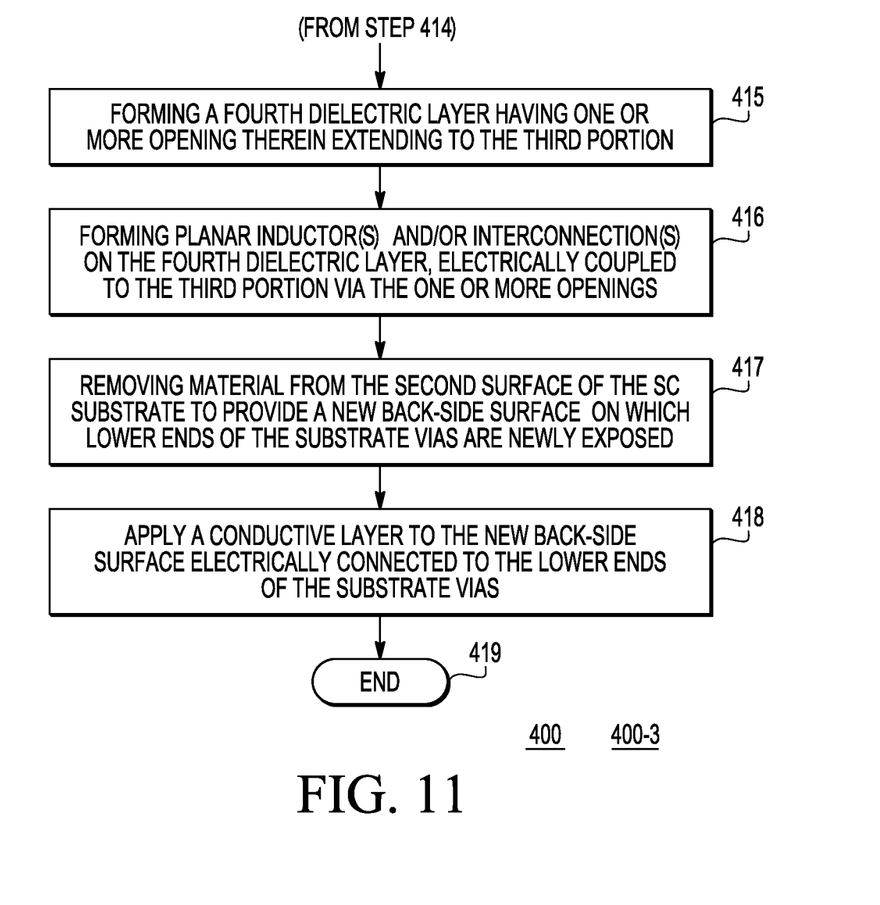

FIGS. 9-11 show a simplified flow chart illustrating method 400 for forming part or all of the circuit and structures of FIGS. 3-7, according to yet additional embodiments of the invention. It will be understood by those of skill in the art that while method 400 is useful for forming all or part of the circuit and structures illustrated in FIGS. 3-7, it can also be used to form other circuits and structures containing more or fewer capacitors, inductors and transistors and is not limited merely to implementing the circuit of FIG. 3. For convenience of presentation, the flow chart of method 400 is divided into three parts, portion 400-1 in FIG. 9, portion 400-2 in FIG. 10 and portion 400-3 in FIG. 11. Following START 401, initial step 402 is performed wherein a high resistivity initial SC substrate (e.g., substrate 60-$i$, see FIG. 5 and associated discussion) is provided having opposed first and second surfaces. This substrate is referred to as initial substrate 60-$i$ with initial thickness 61-$i$ and initial lower surface 62-*i* to distinguish it from thinned substrate 60 of FIGS. 4-7 that has smaller thickness (e.g., thickness 61) and lower surface 62 newly exposed after thinning, as described in connection with FIG. 8, which description is incorporated herein by reference. In step 403, one or more transistors (e.g., transistor 41, 41', 67) is formed in initial SC substrate 60-*i* having an input terminal (e.g., gate 50, 50', 74), an output terminal (e.g., drain 52, 52', 70, 78) and a reference terminal (e.g., source 51, 51', 76, 79), proximate the first surface (e.g., surface 63 of FIGS. 4-7). In step 404 at least a first dielectric layer (e.g., layer 81) is provided over the first surface (e.g., surface 63). Then steps 405 and 406 are provided in either order as indicated by first path 405-1, 406-1, 406-3 (which is preferred), or alternate second path 405-2,406-2, 405-3 (which is also useful). In step 405, one or more conductor filled substrate-vias (e.g., vias 49, 98, 98') are formed extending into initial SC substrate 60-*i* through the first surface (e.g., surface 63) and having initially buried inner ends 982 (see FIG. 5). In step 406, first interlayer conductive vias (e.g., vias 90-1, 90-2, 90-4) are formed, coupled to at least a first (e.g., terminal 76, 79) of the terminals (e.g., terminals 76, 79, 74, 78 of transistor 41'). In step 407 a "first metal" layer (e.g., layer 91) is provided over the first dielectric layer (e.g., layer 81) and having at least a first portion (e.g., portion 91-2) coupling the first terminal (e.g., terminal 76, 79) to a substrate via (e.g., via 49', 98, 98') and another portion (e.g., 91-1) coupled to another terminal (e.g., drain terminal 78) by another part (e.g., 90-1) of the first interlayer via. In step 408, a second dielectric layer (e.g. layer 82) is formed over the "first metal" (e.g., layer 91). In step 409, second interlayer conductive vias (e.g., interlayer vias 90-2) are provided coupled at least to the another portion (e.g., portion 91-1) of the "first metal" (e.g., layer 91) and extending through the second dielectric layer (e.g., layer 82). In step 410, a "second metal" layer (e.g., layer 92) is formed overlying the second dielectric layer (e.g., layer 82) and having a second portion (e.g., portion 92-1) coupled to some of the second interlayer vias (e.g., vias 90-2). In step 411, a planar capacitor (e.g., capacitor 42', 43') is provided on part (e.g., part 92-3 and/or 92-4) of the second metal layer (e.g., layer 92) and having an upper electrode (e.g., electrode 102, 104). In step 412, a third dielectric layer (e.g., layer 83) is formed over the upper electrode (e.g., electrode 102, 104) and otherwise exposed parts of the "second metal" layer (e.g., layer 92). In step 413, third conductive interlayer vias (e.g., vias 90-3) are formed coupled at least to the upper electrode (e.g., electrode 102, 104) and extending through the third dielectric layer (e.g., layer 83). In step 414, a "third metal" layer (e.g., layer 93) is provided having a third portion (e.g., 93-3, 93-4 and/or 93-5) contacting at least part of the third interlayer conductive vias (e.g., vias 90-3). In step 415, a fourth dielectric layer (e.g., layer 84) is provided having one or more openings (e.g., opening 84-1, 84-2, 84-3 and/or 84-4) extending to the third portion (e.g., portion 93-3, 93-4 and/or 93-5). In step 416, a planar inductor (e.g., inductor 44', 45') and/or interconnections (e.g., 56, 57, 52-1 and/or 50-1, etc.) are provided on the fourth dielectric layer (e.g., layer 84) coupled to the third portion (e.g., portion 93-3, 93-4 and/or 93-5) via the one or more openings (e.g., opening 84-1, 84-2, 84-3 and/or 84-4). In step 417, the second surface (e.g., surface 62-*i*) of the initial substrate (e.g., substrate 60-*i*) is, for example, back-lapped, etched or otherwise abraded, to remove thickness 61-1 of initial substrate 61-*i* so as to provide a new back-side surface (e.g., surface 62) on which inner ends (e.g., ends 982) of the substrate vias (e.g., vias 49', 98, 98') are newly exposed so that in step 418, back-metal or other conductor (e.g., conductor 49', 69) can be applied in contact with the newly exposed ends (e.g., ends 982) of the substrate vias (e.g., vias 49', 98, 98'), thereby providing low resistance Ohmic contact with those terminals or leads of the transistor and/or capacitors and/or inductors coupled thereto via the substrate vias, (e.g., TSVs 49', 98, 98'). Method 400 then proceeds substantially to END 419.

According to a first embodiment, there is provided a monolithic microwave integrated circuit (46, 58), comprising, a semiconductor substrate (60) having a bulk resistivity equal or greater than about 100 Ohm-cm, and having a front surface (63) and a rear surface (62), at least one transistor (41) formed in the semiconductor substrate (60) and having an input terminal (50), an output terminal (52) and a reference terminal (51), at least one capacitor (42', 43') monolithically formed over the semiconductor substrate (60), at least one inductor (44', 45') monolithically formed over the semiconductor substrate (60), and planar interconnections overlying the semiconductor substrate (60) coupling the at least one transistor (41'), capacitor (42', 43'), and inductor (44', 45') to form the monolithic integrated circuit (46, 58). According to a further embodiment, the monolithic microwave integrated circuit (46, 58), further comprising an input node (53, 53') thereof and an output node (54, 54') thereof, both supported by the front surface (63) of the semiconductor substrate (60), and a reference node (49, 69) thereof supported by the rear surface (62) of the semiconductor substrate (60). According to a still further embodiment, the monolithic microwave integrated circuit (46, 58) further comprises multiple conductive through-substrate vias (49', 98, 98') coupling one or more of the at least one transistor (41), the at least one capacitor (42', 43') and the at least one inductor (44', 45') to the reference node (49, 69, 69'). According to a yet further embodiment, a first (49-2') of the multiple conductive through-substrate vias (49', 98, 98') couples the reference terminal (51', 76) of the at least one transistor (41') to the reference node (49, 69). According to a still yet further embodiment, a second (49-1') of the multiple through-substrate vias (49', 98, 98') couples a first terminal (42-2') of the at least one capacitor (42') to the reference node (49, 69). According to a yet still further embodiment, the at least one transistor (41') is a lateral transistor. According to another embodiment, the at least one capacitor (42', 43') is a planar capacitor, and the at least one inductor (44', 45') is a planar inductor. According to still another embodiment, the semiconductor substrate (60) further comprises, multiple conductive through-substrate vias (49', 98, 98') each having a terminal coupled to the reference node (49, 69, 69'), two monolithic capacitors (42', 43') formed over the front surface (63) of the semiconductor substrate (60), each having first (42-1', 43-1') and second (42-1', 43-2') terminals, two monolithic inductors (44', 45') formed over the front surface (63) of the semiconductor substrate (60), each having first and second terminals, wherein the first terminal (42-1') of the first capacitor (42') is coupled to the first terminal of the first inductor (44') and the second terminal (42-2') of the first capacitor (42') is coupled to a first (49-1') of the multiple through substrate vias (49', 98, 98'), and the second terminal of the first inductor (44') is coupled to the input terminal (50) of the transistor (41'), wherein the second capacitor (43') and second inductor (45') are serially coupled to form a combination (43', 45'), the combination (43', 45') having first and second terminals, and wherein the first terminal of the combination (43', 45') is coupled to the output terminal (52') of the at least one transistor (41') and the second terminal of the combination (43', 45') is coupled to a second (49-2') of the multiple conductive through-substrate vias (49', 98, 98'). According to yet another embodiment, the at least one inductor (44', 45') comprises a high conductivity metal about 0.1-10 micrometers thick.

According to a second embodiment, there is provided a method for forming a monolithic microwave integrated circuit (46, 58) having an input terminal (47), an output terminal (48) and a reference terminal (49, 69, 69'), the method comprising, providing a high resistivity initial semiconductor substrate (60-*i*) having an initial thickness (61-*i*) between a first surface (63) and an initial second surface (62-*i*), forming at least one transistor (41') in the initial semiconductor substrate (60-*i*) with input terminal (50, 50', 74), output terminal (52, 52', 70, 78) and reference terminal (51, 51', 76, 79) proximate the first surface (63), forming one or more conductor filled substrate vias (49', 98, 98') extending into the initial semiconductor substrate (60-*i*) through the first surface (63), forming one or more planar capacitors (42', 43') over the first surface (63) of the initial substrate (60-*i*), each capacitor (42', 43') having first (42-1', 43-1') and second (42-2', 43-2') terminals, forming one or more planar inductors (44', 45') over the first surface (63) of the initial substrate (60-*i*), wherein the first terminal (42-1', 43-1') or the second terminal (42-2', 43-2') of the one or more planar capacitors (42', 43') is coupled to a first terminal or a second terminal of the one or more planar inductors (44', 45') wherein other terminals of the one or more planar inductors (44', 45') are coupled to through substrate vias (49', 98, 98'), to one or more terminals (50', 52') of the transistor (41') or to one or more terminals (47, 48, 49) of the microwave integrated circuit (46, 58), reducing the initial thickness (61-*i*), thereby creating a new rear surface (62) of a thinned substrate (60) on which inner ends (982) of the substrate vias (49', 98, 98') are exposed, and applying a conductor (69) to the new rear surface (62) of the thinned substrate (60) so that the exposed inner ends (982) of the substrate vias (49', 98, 98') are electrically connected to the conductor (69). According to a further embodiment, the step of forming one or more planar capacitors (42', 43') comprises, forming first and second planar capacitors (42', 43') over the first surface (63) of the initial substrate (60-*i*), each capacitor (42', 43') having first (42-1', 43-1') and second terminals (42-2', 43-2'), the step of forming one or more planar inductors (44', 45') comprises, forming first and second planar inductors (44', 45') over the first surface (63), each inductor having first and second terminals, and wherein the first terminal (42-1') of the first capacitor (42') is coupled to the first terminal of the first inductor (44') and the second terminal of the first inductor (44') is coupled to the transistor input (50'), and wherein the first terminal (43-1') of the second capacitor (43') is coupled to the transistor output (52') and the second terminal (43-2') of the second capacitor (43') is coupled to the first terminal of the second inductor (45'), and wherein the second terminal (42-2') of the first capacitor (42'), the second terminal of the second inductor (45') and the reference terminal (51') of the transistor (41') are coupled to at least one of the conductor filled substrate vias (49', 98, 98'). According to a still further embodiment, the initial substrate (60-*i*) has a resistivity equal or greater than about 100 Ohm-cm. According to a yet further embodiment, initial substrate (60-*i*) has a resistivity equal or greater than about 500 Ohm-cm. According to a still yet further embodiment, the initial substrate (60-*i*) has a resistivity equal or greater than about 1000 Ohm-cm. According to a yet still further embodiment, the step of forming one or more planar inductors (44', 45') comprises, forming the inductors using copper, gold, silver or a combination thereof. According to another embodiment, the copper, gold, silver or combination thereof is at least about 3 micrometers thick.

According to a third embodiment, there is provided a monolithic microwave integrated circuit (46, 58) having a circuit input terminal (47'), a circuit output terminal (48') and a circuit reference terminal (49, 49', 69, 69'), comprising, a semiconductor substrate (60) having a bulk resistivity equal or greater than about 100 Ohm-cm, and having a front surface (63) and a rear surface (62), wherein the rear surface (62) has thereon the circuit reference terminal (49, 49', 69, 69'), at least one LDMOS transistor (41') formed in the substrate (60) and having a transistor input terminal (50'), a transistor output terminal (52') and a transistor reference terminal (51'), wherein the transistor reference terminal (51') is coupled to the circuit reference terminal (49, 49', 69, 69'), at least first (42') and second (43') monolithic planar capacitors overlying the front surface (63'), at least first (44') and second (45') monolithic planar inductors overlying the front surface (63'), and wherein the first capacitor (42') is coupled between the circuit input terminal (47') and the circuit reference terminal (49, 49', 69, 69'), and the first inductor (44') is coupled between the circuit input terminal (47') and the transistor input terminal (50'), and wherein the second capacitor (43') and the second inductor (45') are coupled in series to from a combination (43', 45'), and a first terminal of the combination (43', 45') is coupled to the transistor output terminal (52') and to the circuit output terminal (48') and a second terminal of the combination (43', 45') is coupled to the circuit reference terminal (49, 49', 69, 69'). According to a further embodiment, the substrate (60) substantially comprises float zone silicon. According to a still further embodiment, at least one of the first and second inductors (44', 45') is formed from substantially high purity copper. According to a yet further embodiment, the high purity copper has a thickness of at least about 0.5 micrometers.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A monolithic microwave integrated circuit, comprising:
    a semiconductor substrate having a front surface, a rear surface, and a bulk resistivity equal to or greater than 100 Ohm-cm;
    a transistor proximate to the front surface of the semiconductor substrate, wherein the transistor has a doped common region in the semiconductor substrate;
    multiple conductive through-substrate vias (TSVs) extending from the front surface to the rear surface of the semiconductor substrate;
    electrical interconnections overlying the front surface of the semiconductor substrate to electrically couple the transistor with at least some of the multiple conductive TSVs; and
    a reference node supported by a rear surface of the semiconductor substrate and electrically coupled with at least some of the multiple conductive TSVs.

2. The integrated circuit of claim 1, further comprising:
    a dielectric layer over the front surface of the semiconductor substrate and overlying the doped common region; and
    multiple interlayer conductive vias in the first dielectric layer and electrically coupled to the doped common region and to the electrical interconnections.

3. The integrated circuit of claim 1, wherein first ones of the multiple conductive TSVs electrically couple the doped common region of the transistor to the reference node.

4. The integrated circuit of claim 3, further comprising:
a capacitor that is monolithically formed over the semiconductor substrate, wherein second ones of the multiple conductive TSVs electrically couple a first terminal of the capacitor to the reference node.

5. The integrated circuit of claim 1, further comprising:
at least one passive component over the front surface of the semiconductor substrate and electrically coupled to the transistor.

6. The integrated circuit of claim 5, wherein the at least one passive component comprises:
at least one capacitor over the front surface of the semiconductor substrate.

7. The integrated circuit of claim 5, wherein the at least one passive component comprises:
at least one inductor over the front surface of the semiconductor substrate.

8. The integrated circuit of claim 5, wherein the at least one passive component comprises:
two monolithic capacitors formed over the front surface of the semiconductor substrate, each having first and second terminals; and
two monolithic inductors formed over the front surface of the semiconductor substrate, each having first and second terminals,
wherein the first terminal of the first capacitor is coupled to the first terminal of the first inductor and the second terminal of the first capacitor is coupled to a first of the multiple conductive TSVs, and the second terminal of the first inductor is coupled to the doped common region of the transistor,
wherein the second capacitor and second inductor are serially coupled to form a combination, the combination having first and second terminals, and
wherein the first terminal of the combination is coupled to a doped output region of the transistor and the second terminal of the combination is coupled to a second of the multiple conductive TSVs.

9. The integrated circuit of claim 1, wherein each of the multiple conductive TSVs comprise:
a central conductor; and
a dielectric liner between the central conductor and the semiconductor substrate.

10. A monolithic microwave integrated circuit comprising:
a semiconductor substrate having a front surface, a rear surface, and a bulk resistivity equal to or greater than 100 Ohm-cm;
a Laterally-Diffused-Metal-Oxide-Semiconductor (LDMOS) transistor proximate to the front surface of the semiconductor substrate, wherein the LDMOS transistor has a gate, a drain region, and a source region;
multiple conductive through-substrate vias (TSVs) extending from the front surface of the semiconductor substrate to the rear surface of the semiconductor substrate; and
electrical interconnections overlying the front surface of the semiconductor substrate to electrically couple the transistor with at least some of the multiple conductive TSVs.

11. The integrated circuit of claim 10, wherein each of the multiple conductive TSVs comprise:
a central conductor; and
a dielectric liner between the central conductor and the semiconductor substrate.

12. The integrated circuit of claim 10, further comprising:
a reference node supported by the rear surface of the semiconductor substrate and electrically coupled with at least some of the multiple conductive TSVs.

13. The integrated circuit of claim 12, wherein:
the electrical interconnections electrically couple the source region with first ones of the multiple conductive TSVs, and the first ones of the multiple conductive TSVs are connected to the reference node.

14. The integrated circuit of claim 10, wherein the semiconductor substrate has a bulk resistivity equal to or greater than 500 Ohm-cm.

15. The integrated circuit of claim 10, wherein the semiconductor substrate substantially comprises float zone silicon.

16. A monolithic microwave integrated circuit comprising:
a semiconductor substrate having a front surface and a rear surface;
a transistor at least partially formed in the semiconductor substrate, wherein the transistor includes a doped common region;
a first dielectric layer over the front surface of the semiconductor substrate;
a first through-substrate via ("TSV") extending through the first dielectric layer and the semiconductor substrate, wherein a region of the semiconductor substrate through which the first TSV passes has a bulk resistivity equal to or greater than 1000 Ohm-cm;
an interlayer via in the first dielectric layer, the first TSV electrically coupled to the doped common region of the transistor through the interlayer via;
a passive component formed over the front surface of the semiconductor substrate;
planar interconnections overlying the front surface of the semiconductor substrate and coupling the transistor and the passive component; and
a reference node supported by the rear surface of the semiconductor substrate, which is electrically coupled to the transistor through the first TSV.

17. The integrated circuit of claim 16, wherein the passive component comprises:
a capacitor formed over the front surface of the semiconductor substrate.

18. The integrated circuit of claim 17, wherein the capacitor is a monolithically formed planar capacitor.

19. The integrated circuit of claim 16, wherein the passive component comprises:
an inductor formed over the front surface of the semiconductor substrate.

20. The integrated circuit of claim 19, wherein the inductor is a monolithically formed planar inductor.

* * * * *